United States Patent
Bernard et al.

(10) Patent No.: US 6,717,473 B1
(45) Date of Patent: Apr. 6, 2004

(54) METHOD OF FORMING AN AUDIO AMPLIFIER VOLTAGE REFERENCE AND STRUCTURE THEREFOR

(75) Inventors: Patrick Bernard, Saint Martin le Vinoux (FR); Anthony Quelen, Grenoble (FR); Christian Perrin, Saint Georges de Commiers (FR)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/270,413

(22) Filed: Oct. 15, 2002

(51) Int. Cl.[7] ................................................. H03F 3/04
(52) U.S. Cl. ....................................... 330/296; 330/297
(58) Field of Search ................................. 323/280, 286, 323/287; 330/296, 297; 381/120

(56) References Cited

U.S. PATENT DOCUMENTS 5,751,823 A * 5/1998 Strickland et al. ...... 330/297 X
5,850,139 A * 12/1998 Edwards ..................... 323/280

* cited by examiner

Primary Examiner—Steven J. Mottola
(74) Attorney, Agent, or Firm—Robert F. Hightower

(57) ABSTRACT

An audio amplifier system (10) is formed to include a voltage reference (16). The voltage reference (16) is formed to utilize a filter having a first cut-off frequency when the output (14) of the voltage reference (16) is less than a first value and to use a second cut-off frequency when the output (14) is greater than the first value.

12 Claims, 3 Drawing Sheets

METHOD OF FORMING AN AUDIO AMPLIFIER VOLTAGE REFERENCE AND STRUCTURE THEREFOR

BACKGROUND OF THE INVENTION

The present invention relates, in general, to electronics, and more particularly, to methods of forming semiconductor devices and structure.

In the past, the electronics industry utilized various approaches to forming voltage references for audio amplifiers. These audio amplifiers required a stable reference voltage with low settling times in order to provide high quality audio amplification that had good power supply noise rejection. In general, a very high quality voltage regulator was utilized to provide a power source and the reference voltage was developed from this power source. Often, a filter was used on the output of the voltage reference in order to improve power supply noise rejection at low frequencies, such as frequencies below about five Hz. One problem with such audio amplifier systems was system cost. The low dropout voltage regulator was complicated and expensive to implement and increased system cost. Additionally, the filter often had a cut-off frequency of approximately two to three Hz. Such high cut off frequencies resulted in poor power supply noise rejection.

Accordingly, it is desirable to have an audio amplifier voltage reference that has a low cut-off frequency, that does not require a high quality voltage regulator, and that has a fast settling time.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

Figure 1:
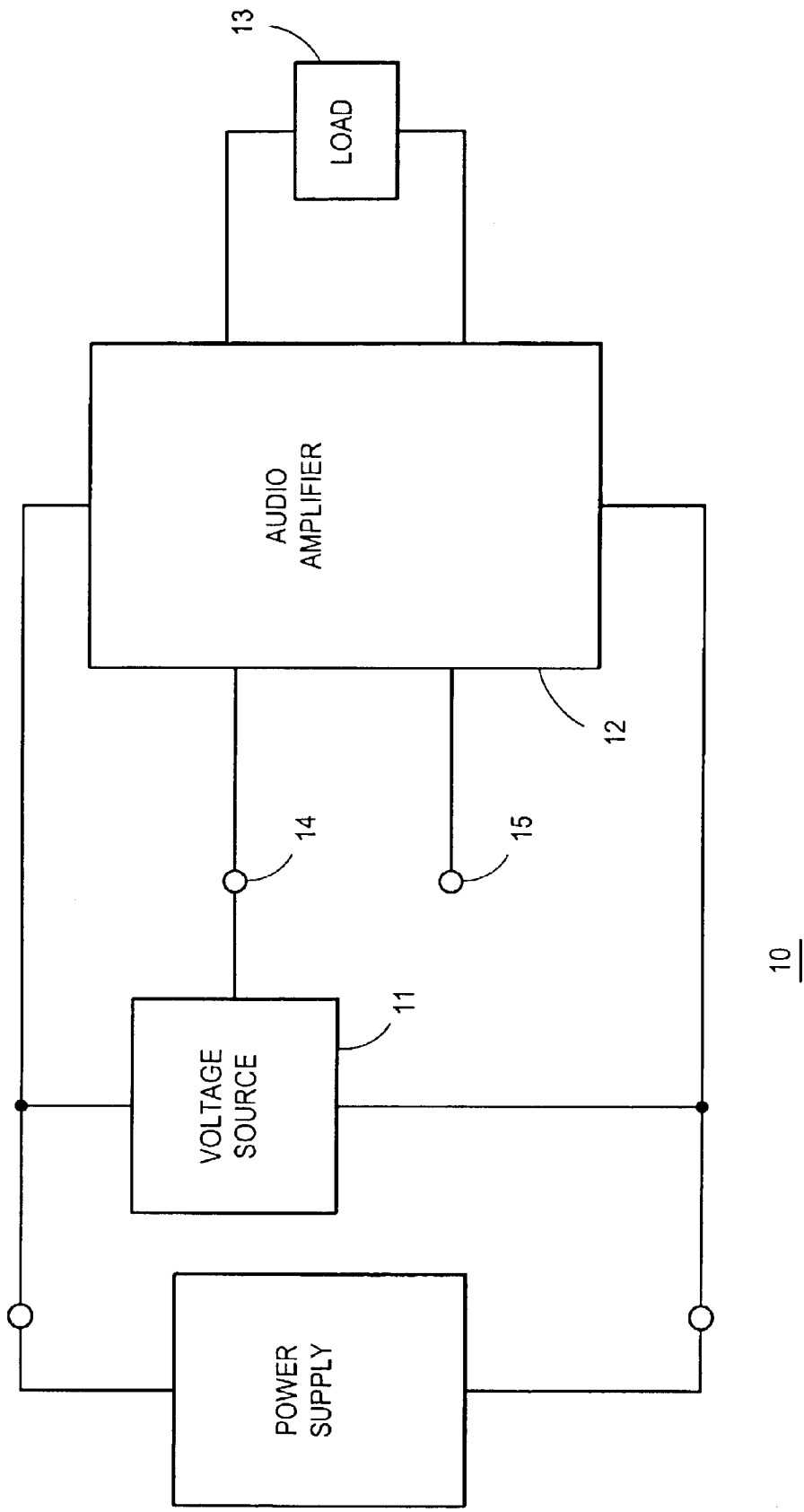
FIG. 1 schematically illustrates an embodiment of a portion of an audio amplifier system in accordance with the present invention.

FIG. 1 schematically illustrates a portion of an embodiment of an audio amplifier system 10 that has good power supply noise rejection. System 10 includes a power supply that provides a stable power source, such as a battery, for system 10. A voltage source 11 receives power from the power supply and provides a reference voltage on a reference voltage output 14. An audio amplifier 12 receives the reference voltage and also receives an audio signal on an audio input 15. Amplifier 12 amplifies the audio signal and provides an amplified audio signal to a load 13.

Figure 2:
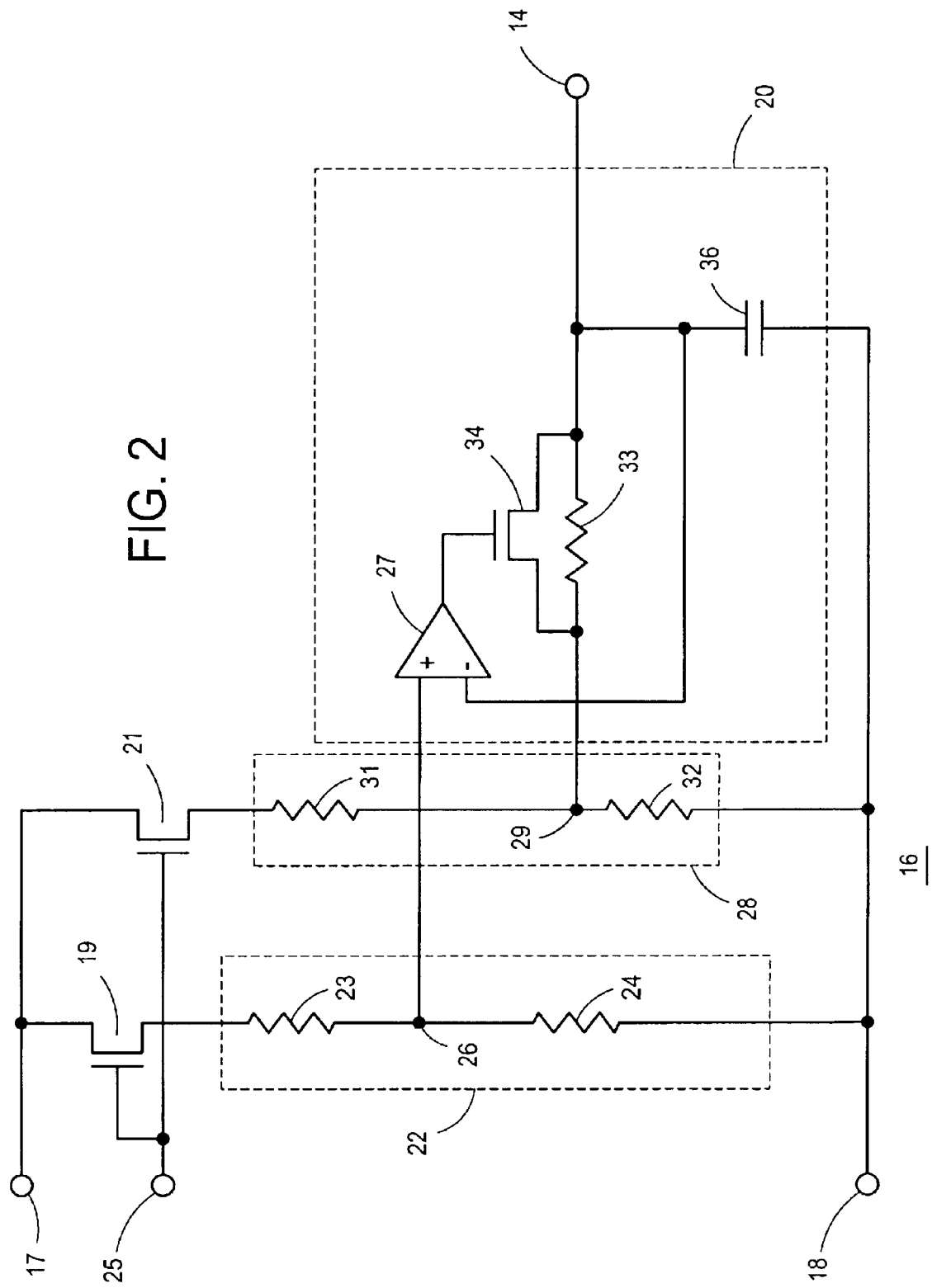
FIG. 2 schematically illustrates an embodiment of a portion of an audio amplifier voltage reference in accordance with the present invention.

FIG. 2 schematically illustrates a portion of an embodiment of an audio amplifier voltage reference 16 that is a portion of voltage source 11 shown in FIG. 1. Reference 16 is formed to include an internal voltage reference 22, a filter 20, and a common mode reference circuit 28, all generally illustrated by dashed boxes. Reference 22 is formed to generate a first reference voltage value or internal reference voltage on a reference node 26. Reference circuit 28 is formed to develop a reference voltage that is applied to output 14 to generate the output voltage of reference 16. Filter 20 is formed to select a first filter time constant and cut-off frequency while the output voltage on output 14 is less than the internal reference voltage value and to select a second time constant and cut-off frequency while the output voltage on output 14 is equal to or greater than the internal reference voltage value.

Filter 20 includes a comparator 27, a filter capacitor 36, a filter resistor 33, and a filter transistor 34. Resistor 33 and transistor 34 function as a switchable resistor having a value that is switched between a first resistance and a second resistance by the output of comparator 27 in order to assist in changing the time constant and cut-off frequency of reference 16. Internal voltage reference 22 includes a first reference resistor 23 and a second reference resistor 24 that are connected in series to form a voltage divider in between a power source input 17 and a power return 18. An optional stand-by transistor 19 is used to couple the voltage from input 17 to resistors 23 and 24. A first common mode resistor 31 and a second common mode resistor 32 are connected in series to form a voltage divider. An optional stand-by transistor 21 is used to couple the voltage from input 17 to resistors 31 and 32. Transistors 19 and 21 are utilized to reduce power consumption when reference 16 is placed in a stand-by mode. A stand-by input 25 receives a stand-by signal to place reference 16 in the stand-by mode. The gate of transistors 19 and 21 are connected to input 25. Transistors 19 and 21 may be omitted in some embodiments.

In operation, when power is initially applied, capacitor 36 is discharged and the output voltage at output 14 is much less than the value of the internal reference voltage at node 26. Consequently, the output of comparator 27 is high thereby turning on transistor 34 and switching the value of the switchable resistor to a first resistance value or the on-resistance of transistor 34. Consequently, reference 16 has the first time constant and first cut-off frequency determined by the time constant of capacitor 36 and the node 29 resistance in series with the on-resistance of transistor 34. The node 29 resistance is the parallel equivalent of resistors 31 and 32 seen from node 29 and is the resistance of resistor 31 multiplied by the resistance of resistor 32 and that product divided by the sum of the resistances of resistors 31 and 32 $((R31 \times R32)/(R31+R32))$. Since the on-resistance of transistor 34 is very low, the value of the node 29 resistance and capacitor 36 are chosen to provide a small first time constant and low first cut-off frequency for filter 20 in order to effectively filter noise from the power supply at frequencies that are above this first cut-off frequency. The first cut-off frequency typically is a value that is less than approximately one Hz (1 Hz) and larger than the second cut-off frequency that is discussed hereinafter. The value of resistors 31 and 32 also set the value of the voltage applied to output 14. Since this voltage is desired to be about half way between the voltages applied to input 17 and return 18, resistors 31 and 32 generally have the same value. Additionally, the value of resistors 31 and 32 and capacitor 36 are chosen to provide the desired settling time for reference 16. In the preferred embodiment, the settling time is between approximately four hundred to five hundred micro-seconds (400–500 micro-sec). Typically, resistors 31 and 32 have a value between approximately two hundred thousand and six hundred thousand ohms (200 K-ohms to 600 K-ohms) and preferably each is about three hundred thousand ohms (300 K-ohms). As capacitor 36 charges through resistor 31 and the voltage on output 14 reaches a value that is equal to the value of the internal reference voltage at node 26, the output of comparator 27 goes low thereby turning off transistor 34. Turning off transistor 34 switches the value of the switchable resistor to the second value thereby changing the time constant and cut-off frequency. The second time constant and cut-off frequency of filter 20 is now established by the value of capacitor 36 and resistor 33 in series with resistor 31. The value of resistor 33 and capacitor 36 are chosen to provide the second time constant and cut-off frequency that provides good power supply noise rejection during operation of amplifier 12 (see FIG. 1). Resistor 33 generally is chosen to have a value that is much greater than that of resistors 31 and 32 in order to ensure that the value of resistor 33 dominates the cut-off frequency. Typically, the second cut-off frequency is formed to have a value of approximately 0.01 to less than 1.0 Hz and preferably is about 0.1 Hz in order to provide good power supply noise rejection at low frequencies. Resistor 33 generally varies from one million to ten million ohms (1 to 10 M-ohms) and preferably is about five meg-ohms (5 M-ohms). Capacitor 36 generally has a value of about 0.4 to 10.0 micro-farads and preferably is about 1.0 micro-farads. Consequently, it can be seen that reference 16 is formed to have a first filter time constant and cut-off frequency while the output voltage is less than the first or internal reference voltage value and to have a second time constant and cut-off frequency while the output voltage is equal to or greater than the first reference voltage value.

In one example of using reference 16, resistors 23, 31, and 32 each had a value of three hundred thousand ohms (300 K-ohms), resistor 33 had a value of five M-ohms, resistor 24 had a value of two hundred fifty thousand ohms (250 K-ohms), and capacitor 36 had a value of one micro-farad. In operation, the reference provides an improvement of fifteen to twenty decibels (15–20 db) over a frequency of one hertz to five hundred kilo-hertz (1 Hz to 500 KHz).

Reference 16 facilitates this operation by connecting a first terminal of capacitor 36 to output 14 and connecting a second terminal to return 18. Resistor 33 is formed have a first terminal connected to output 14 and to a drain of transistor 34, and a second terminal connected to node 29 and to a source of transistor 34. A gate of transistor 34 is connected to the output of comparator 27 which has a non-inverting input connected to node 26 and an inverting input connected to output 14. Resistor 31 is formed to have a first terminal connected to node 29 and a second terminal connected to a drain of transistor 21. Transistor 21 has a source connected to input 17 and a gate that is connected to input 25. Resistor 32 also has a first terminal connected to node 29 and a second terminal connected to return 18. Resistor 23 has a first terminal connected to node 26 and a second terminal connected to a source of transistor 19. Transistor 19 has a drain connected to input 17 and a gate connected to input 25. Resistor 24 has a first terminal connected to node 26 and a second terminal connected to return 18.

Figure 3:
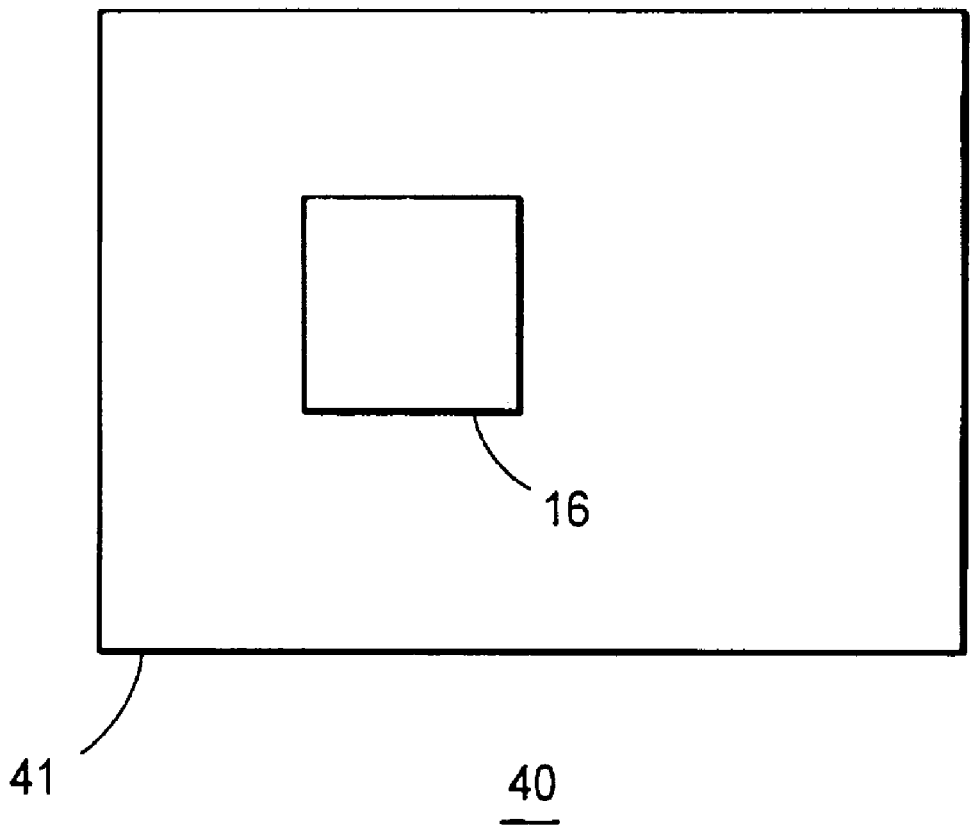
FIG. 3 schematically illustrates an enlarged plan view of a portion of an embodiment of a semiconductor device having an audio amplifier voltage reference in accordance with the present invention.

FIG. 3 schematically illustrates an enlarged plan view of a portion of an embodiment of a semiconductor device 40 having reference 16 formed on a semiconductor die 41. The placement and size of reference 16 is merely for illustration and is not intended to portray any placement, location, or size relative to die 41.

In view of all of the above, it is evident that a novel method of forming an audio amplifier reference is disclosed along with a structure therefor. Forming the reference to have a first time constant while the output voltage is less than a first value allows forming the reference to have a fast settling time. Changing the time constant to the second value provides the reference a lower time constant that provides good power supply rejection during the operation of the reference.

While the invention is described with specific preferred embodiments, it is evident that many alternatives and variations will be apparent to those skilled in the semiconductor arts. For example a specific filter circuit is implemented uses comparator 27 and transistor 34 to switch between the first and second time constants. However, other circuits can provide the same functionality without using comparator 27 or transistor 34.

What is claimed is:

1. A method of forming an audio amplifier voltage reference comprising:

forming an output filter of the audio amplifier voltage reference a having first cut-off frequency while an output voltage is less than a first value and having a second cut-off frequency while the output voltage is at least equal to the first value wherein the second cut-off frequency is less than the first cut-off frequency including forming the audio amplifier voltage reference to generate the first value and to compare the output voltage to the first value.

2. The method of claim 1 wherein forming the output filter includes forming the audio amplifier voltage reference to increase a value of a filter resistance when the output voltage is at least equal to the first value.

3. The method of claim 2 wherein forming the audio amplifier voltage reference to increase the value of the filter resistance includes forming the audio amplifier voltage reference to couple a filter resistor in series with a filter capacitor when the output voltage is at least equal to the first value.

4. The method of claim 1 wherein forming the output filter includes forming the first cut-off frequency to be no greater than approximately one hertz and forming the second cut-off frequency to be no greater than approximately 0.1 hertz.

5. The method of claim 1 wherein forming the output filter includes using a resistive voltage divider to form the first value.

6. A method of forming an audio amplifier voltage reference comprising:

forming an internal reference voltage having a first internal reference voltage value;

comparing an output voltage of the audio amplifier voltage reference to the first internal reference voltage value; and filtering the output voltage using a first cut-off frequency when the output voltage is less than the first internal reference voltage value end using a second cut-off frequency when the output voltage is at least equal to the first internal reference voltage value wherein the second cut-off frequency is less than the first cut-off frequency.

7. The method of claim 6 wherein using the first cut-off frequency when the output voltage is less than the first internal reference voltage value and using the second cut-off frequency when the output voltage is at least equal to the first internal reference voltage value includes shorting out a filter resistor of an output filter when the output voltage is less the first internal reference voltage value and coupling the filter resistor in series with a capacitor when the output voltage is at least equal to the first internal reference voltage value.

8. The method of claim 7 wherein coupling the filter resistor in series with the capacitor includes coupling a filter transistor across the filter resistor, and wherein comparing the output voltage of the audio amplifier voltage reference to the first internal reference voltage value includes coupling a comparator to the filter transistor when the output voltage in less than the first internal reference voltage value.

9. The method of claim 6 wherein filtering the output voltage includes forming the first cut-off frequency no greater than one hertz and forming the second cut-off frequency no greater than 0.1 herts.

10. An audio amplifier voltage reference comprising:

a power input and a power return;

a comparator having a non-inverting input coupled to a first reference node, an inverting output coupled to an output of the audio amplifier voltage reference, and an output;

a filter resistor having a first terminal coupled to a second reference node and a second terminal;

a capacitor having first terminal coupled to the second terminal of the filter resistor and to the output of the audio amplifier voltage reference, and a second terminal coupled to the power return; and a transistor coupled in parallel across the filter resistor and having a control electrode coupled to the output of the comparator.

11. The audio amplifier voltage reference of claim 10 further including a first resistor having a first terminal coupled to the first reference node and a second terminal coupled to the power return and including a second resistor having a first terminal coupled to the first reference node and a second terminal coupled to the power input.

12. The audio amplifier voltage reference of claim 10 further including a third resistor having a first terminal coupled to the second reference node and a second terminal coupled to the power return and including a fourth resistor having a first terminal coupled to the second reference node and a second terminal coupled to the power input.

* * * * *